United States Patent
Park et al.

(10) Patent No.: US 8,569,869 B2
(45) Date of Patent: Oct. 29, 2013

(54) INTEGRATED CIRCUIT PACKAGING SYSTEM WITH ENCAPSULATION AND METHOD OF MANUFACTURE THEREOF

(75) Inventors: HyungSang Park, Hanam-si (KR); A Leam Choi, Ichon-si (KR); JoHyun Bae, Seoul (KR)

(73) Assignee: Stats Chippac Ltd., Singapore (SG)

( * ) Notice: Subject to any disclaimer, the term of this patent is extended or adjusted under 35 U.S.C. 154(b) by 298 days.

(21) Appl. No.: 12/729,841

(22) Filed: Mar. 23, 2010

(65) Prior Publication Data

US 2011/0233736 A1 Sep. 29, 2011

(51) Int. Cl.
| H01L 23/552 | (2006.01) |
| H01L 29/40 | (2006.01) |
| H01L 21/44 | (2006.01) |
| H01L 21/48 | (2006.01) |
| H01L 21/50 | (2006.01) |

(52) U.S. Cl.
USPC .......... 257/659; 257/660; 257/664; 257/508; 438/69; 438/106; 438/126; 438/127

(58) Field of Classification Search
USPC ......... 257/659, 664, 662, 508, 690, 660, 294, 257/98, 435; 438/348, 361, 124, 118, 48, 438/70, 731, 106, 107, 112, 126, 127, 69
See application file for complete search history.

(56) References Cited

U.S. PATENT DOCUMENTS

| 5,977,633 | A | 11/1999 | Suzuki et al. | |
| 6,933,598 | B2 | 8/2005 | Karnezos | |
| 7,196,427 | B2 | 3/2007 | Mangrum | |
| 7,217,993 | B2 | 5/2007 | Nishimura | |
| 7,261,596 | B2 | 8/2007 | Akaike et al. | |
| 7,317,247 | B2 | 1/2008 | Lee et al. | |
| 7,432,586 | B2 * | 10/2008 | Zhao et al. | 257/685 |
| 7,514,774 | B2 | 4/2009 | Leung et al. | |
| 7,537,962 | B2 | 5/2009 | Jang et al. | |
| 7,579,672 | B2 | 8/2009 | Wu | |
| 7,667,314 | B2 | 2/2010 | Yoon et al. | |
| 7,701,040 | B2 * | 4/2010 | Huang et al. | 257/659 |
| 7,851,894 | B1 * | 12/2010 | Scanlan | 257/660 |
| 7,880,275 | B2 * | 2/2011 | Pagaila et al. | 257/659 |
| 2007/0200225 | A1 | 8/2007 | Ibrahim et al. | |
| 2009/0302439 | A1 | 12/2009 | Pagaila et al. | |
| 2009/0321898 | A1 | 12/2009 | Pagaila et al. | |
| 2010/0006987 | A1 | 1/2010 | Murugan et al. | |
| 2010/0013065 | A1 * | 1/2010 | Mistry et al. | 257/660 |
| 2010/0276792 | A1 * | 11/2010 | Chi et al. | 257/660 |
| 2011/0204494 | A1 * | 8/2011 | Chi et al. | 257/659 |

OTHER PUBLICATIONS

U.S. Appl. No. 12/410,945, filed Mar. 25, 2009, Chi et al.
U.S. Appl. No. 12/711,250, filed Feb. 23, 2010, Chi et al.
U.S. Appl. No. 12/434,367, filed May 1, 2009, Chi et al.
U.S. Appl. No. 12/727,229, filed Mar. 18, 2010, Yoon et al.

* cited by examiner

*Primary Examiner* — Chuong A. Luu
(74) *Attorney, Agent, or Firm* — Ishimaru & Associates LLP; I-Chang John Yang

(57) ABSTRACT

A method of manufacture of an integrated circuit packaging system includes: mounting an integrated circuit over a package carrier; mounting a rounded interconnect on the package carrier; mounting a conductive shield over the package carrier, the conductive shield having an elevated portion and a hole adjacent to the elevated portion with the elevated portion over the integrated circuit and the rounded interconnect exposed from the hole; and forming an encapsulation between the conductive shield and the package carrier with the rounded interconnect exposed.

20 Claims, 7 Drawing Sheets

INTEGRATED CIRCUIT PACKAGING SYSTEM WITH ENCAPSULATION AND METHOD OF MANUFACTURE THEREOF

TECHNICAL FIELD

The present invention relates generally to an integrated circuit packaging system, and more particularly to a system for an integrated circuit packaging system with encapsulation.

BACKGROUND ART

Modern electronics, such as smart phones, cell phones, digital cameras, personal digital assistants, location based services devices, and enterprise class appliances, are packing more integrated circuits into an ever shrinking physical space with expectations for decreasing cost. As more functions are packed into the integrated circuits and more integrated circuits into the package, integrated circuit packages must continue to provide a mechanism for making electrical interconnection between the integrated circuit die and the leads that are utilized to make electrical interconnections to circuits, power, and ground external to the integrated circuit die. In the early stages of integrated circuit development, there were relatively few connections between the integrated circuit die and the external circuitry.

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance. Different challenges arise from increased functionality integration and miniaturization.

Thus, a need still remains for an integrated circuit packaging system including high input/output density, low cost, and improved reliability. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: mounting an integrated circuit over a package carrier; mounting a rounded interconnect on the package carrier; mounting a conductive shield over the package carrier, the conductive shield having an elevated portion and a hole adjacent to the elevated portion with the elevated portion over the integrated circuit and the rounded interconnect exposed from the hole; and forming an encapsulation between the conductive shield and the package carrier with the rounded interconnect exposed.

The present invention provides an integrated circuit packaging system, including: a package carrier; an integrated circuit over the package carrier; a rounded interconnect on the package carrier; a conductive shield over the package carrier, the conductive shield having an elevated portion and a hole adjacent to the elevated portion with the elevated portion over the integrated circuit and the rounded interconnect exposed from the hole; and an encapsulation between the conductive shield and the package carrier with the rounded interconnect exposed.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
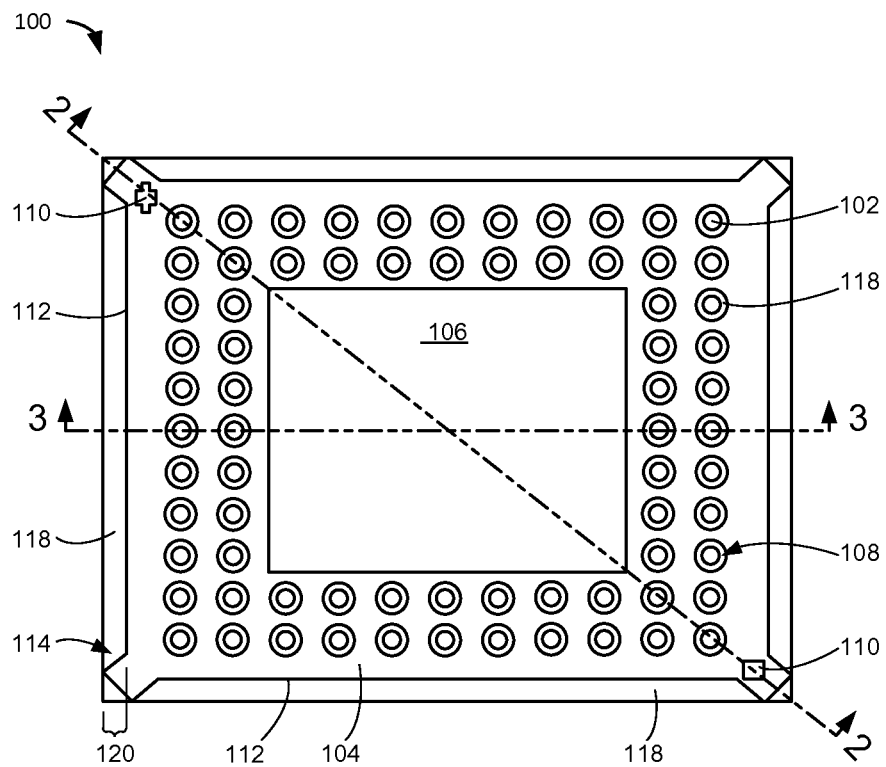
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. For example, the integrated circuit packaging system 100 can be used in applications for package-on-package (PoP) packaging systems. Also for example, the integrated circuit packaging system 100 can be used in applications for a multi-package module, having a top package (e.g. a multi-functional package) stacked over and electrically interconnected to a bottom package by solders with the bottom package having an electromagnetic interference (EMI) shield.

The integrated circuit packaging system 100 can include a rounded interconnect 102, such as a conductive ball or a conductive bump. The rounded interconnect 102 can be formed with solder, a metallic material, an alloy, or a conductive material, providing connectivity to other packaging systems.

The rounded interconnect 102 can be formed in a peripheral array. The rounded interconnect 102 can be used to interconnect the integrated circuit packaging system 100 and other packaging systems stacked thereon (not shown).

The top view is shown with a conductive shield 104, such as a metal shield, the electromagnetic interference (EMI) shield, or a radio frequency (RF) shield. For example, the conductive shield 104 can be utilized in PoP packaging systems. Also for example, the conductive shield 104 can block radio frequency (RF) between adjacent packages or between the integrated circuit packaging system 100 and another packaging system that is stacked thereover.

The conductive shield 104 can be formed with an elevated portion 106 at an interior region of the conductive shield 104. The elevated portion 106 can be surrounded by the peripheral array of the rounded interconnect 102.

The elevated portion 106 is above a perimeter portion 107 of the conductive shield 104 surrounding the elevated portion 106. The conductive shield 104 can have a hole 108 in the perimeter portion 107 with the rounded interconnect 102 therein. The hole 108 can be adjacent to the elevated portion 106. The hole 108 can have a number of geometric shapes, such as a circle, an oval, an ellipse, a rectangle, or a polygon.

The conductive shield 104 can have a fiducial mark 110, such as a special pattern or a mark that can be used as a fixed reference for alignment. The fiducial mark 110 can be formed on the conductive shield 104. The fiducial mark 110 can be at a corner of the conductive shield 104.

The fiducial mark 110 can have any shapes or sizes. For example, the fiducial mark 110 can have a shape of a circle, a square, a rectangle, a polygon, a parallelogram, or a rhombus.

The conductive shield 104 can have an edge 112 partially along a periphery of the conductive shield 104. The conductive shield 104 can have a corner extension 114 at each corner of the conductive shield 104. The edge 112 can be between the corner extension 114 and another of the corner extension 114.

An encapsulation 118, such as a cover including an encapsulant, an epoxy molding compound (EMC), or a molding material, can be formed under the conductive shield 104 partially covering the rounded interconnect 102. The encapsulation 118 can isolate the rounded interconnect 102 from the conductive shield 104 at the hole 108. The rounded interconnect 102 within the hole 108 can be partially exposed from the encapsulation 118.

The encapsulation 118 can extend beyond the edge 112. There can be a gap 120 between the edge 112 and a periphery of the encapsulation 118.

Figure 2:
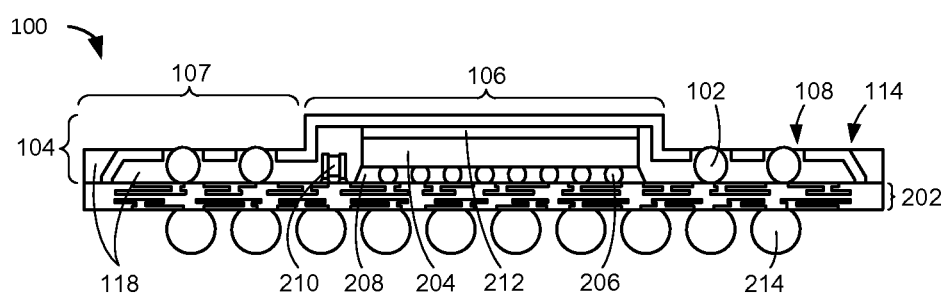
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The integrated circuit packaging system 100 can include a package carrier 202, such as a substrate, a leadframe, or a printed circuit board (PCB).

An integrated circuit 204, such as a flip chip, a radio frequency (RF) die, an integrated circuit die, or a semiconductor device, can be mounted over the package carrier 202. The integrated circuit 204 can be connected to the package carrier 202 with an internal interconnect 206, such as a ball, a bump, or a connector. The internal interconnect 206 can be formed with solder, an alloy, or a conductive material.

An underfill 208, such as an epoxy resin or any underfill resin material, can be dispensed in a space between the package carrier 202 and the integrated circuit 204. The underfill 208 can protect the internal interconnect 206.

A component 210, more specifically a passive device or a discrete component, can be mounted over the package carrier 202. The component 210 can be adjacent to the integrated circuit 204.

The rounded interconnect 102 can be mounted on the package carrier 202. The rounded interconnect 102 can be adjacent to the integrated circuit 204 or the component 210.

An adhesive 212, such as a film or a conductive adhesive, can be attached on the integrated circuit 204. The adhesive 212 can conduct heat away from the integrated circuit 204 to the conductive shield 104.

The conductive shield 104 can be mounted over the package carrier 202 and the integrated circuit 204. For example, the conductive shield 104 can be grounded to limit electromagnetic interference (EMI) between the integrated circuit 204 and other devices in the multi-package module.

The conductive shield 104 can include the elevated portion 106 and the hole 108 adjacent to the elevated portion 106. The rounded interconnect 102 can extend through or exposed from the hole 108.

The conductive shield 104 can be mounted over the package carrier 202. The elevated portion 106 can be mounted over the integrated circuit 204 with the adhesive 212 in between. The corner extension 114 can be mounted on the package carrier 202.

The encapsulation 118 can be formed over the package carrier 202 covering the integrated circuit 204, the underfill 208, and the component 210. The encapsulation 118 can partially cover the rounded interconnect 102.

The encapsulation 118 can be formed between the conductive shield 104 and the package carrier 202. The rounded interconnect 102 within the hole 108 can be partially exposed from the encapsulation 118. The encapsulation 118 can cover a portion of an exterior of the corner extension 114.

The encapsulation 118 can be exposed in the hole 108. The encapsulation 118 can be coplanar with the conductive shield 104 within the hole 108.

An external interconnect 214, such as a ball, a bump, or a connector, can be attached to the package carrier 202. The external interconnect 214 can be formed with solder, an alloy, or a conductive material, providing connectivity to external systems.

The external interconnect 214 can be connected to ground, an external ground potential, or an electrical reference point that is external to the integrated circuit packaging system 100. With the conductive shield 104 attached to the package carrier 202, the conductive shield 104 can be grounded by the external interconnect 214 that is grounded and electrically connected to the package carrier 202.

It has been discovered that the conductive shield 104 effectively shields the integrated circuit 204 from electromagnetic interference (EMI). With the conductive shield 104 mounted on the package carrier 202 and is grounded, the conductive shield 104 over the integrated circuit 204 effectively shields the integrated circuit 204 and prevents EMI. The effective shielding limits EMI between the integrated circuit 204 and other integrated circuits in the multi-package module.

It has also been discovered that the conductive shield 104 and the integrated circuit 204 greatly improve reliability by reducing warpage of the integrated circuit packaging system 100. In package-on-package (PoP) packaging systems where packages are connected and stacked over each other, warpage problems can occur. The warpage problems can cause open or improper solder joints and solder ball bridges. It is important to compensate transformation due to warpage and control the warpage problems. With the conductive shield 104 attached on the package carrier 202 and the encapsulation 118 therebetween covering the rounded interconnect 102, the warpage problems are solved by providing planar rigidity thereby greatly improving reliability.

It has further been discovered that the reliability is also greatly improved with the conductive shield 104 having the fiducial mark 110 of FIG. 1 thereon. With a pattern recognize system (PRS) and the fiducial mark 110, better alignment between the conductive shield 104 and the rounded interconnect 102 is provided, preventing shorts between the rounded interconnect 102 and another of the rounded interconnect 102 or between the rounded interconnect 102 and the conductive shield 104. The reliability is further greatly improved with the integrated circuit 204 as a known good die (KGD), which is individually tested before being assembled into the integrated circuit packaging system 100, resulting in less prone to assembly defects, improved reliability, and increased yields.

It has yet further been discovered that the rounded interconnect 102, the conductive shield 104, and the encapsulation 118 significantly increase input/output (I/O) counts. The conductive shield 104 is attached on the package carrier 202 with the encapsulation 118 therebetween. The rounded interconnect 102 on the package carrier 202 is protected by the encapsulation 118 from faulty solder joints and electrical shorts, thereby allowing the rounded interconnect 102 to be formed in the peripheral array with fine pitches. The fine pitches enable a significant increase in the I/O counts.

It has yet further been discovered that the rounded interconnect 102 and the conductive shield 104 provide a low profile. The elevated portion 106 of the conductive shield 104 is mounted over the integrated circuit 204. With the rounded interconnect 102 adjacent to the integrated circuit 204 and below the elevated portion 106, the present invention has the low profile.

It has yet further been discovered that the conductive shield 104 and the adhesive 212 provide thermal enhancement. With the conductive shield 104 functions as a heat spreader, the adhesive 212 conducts heat away from the integrated circuit 204 to the conductive shield 104 thereby providing the thermal enhancement.

Figure 3:
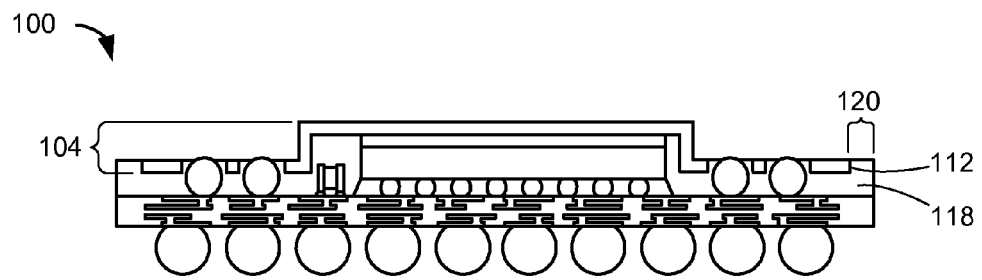
FIG. 3 is a cross-sectional view of the integrated circuit packaging system along a section line 3-3 of FIG. 1.

Referring now to FIG. 3, therein is shown a cross-sectional view of the integrated circuit packaging system 100 along a section line 3-3 of FIG. 1. The conductive shield 104 can have the edge 112 along the periphery of the conductive shield 104.

The encapsulation 118 can be exposed in the gap 120. The encapsulation 118 can be coplanar with the conductive shield 104 in the gap 120.

Figure 4:
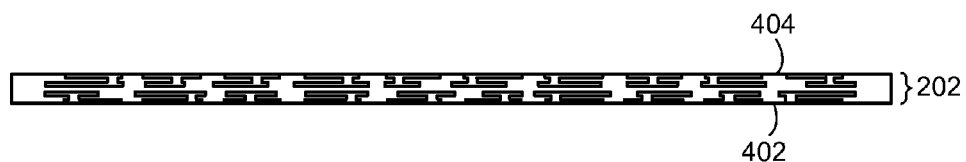
FIG. 4 is a cross-sectional view of a portion of the integrated circuit packaging system of FIG. 1 in a forming phase of the package carrier.

Referring now to FIG. 4, therein is shown a cross-sectional view of a portion of the integrated circuit packaging system 100 of FIG. 1 in a forming phase of the package carrier 202. The package carrier 202 can have a bottom side 402 and a top side 404 at an opposing side to the bottom side 402.

The package carrier 202 can include bond sites, conductive layers, wiring layers, or traces, to provide electrical connectivity. For example, the package carrier 202 can be a bare substrate.

Figure 5:
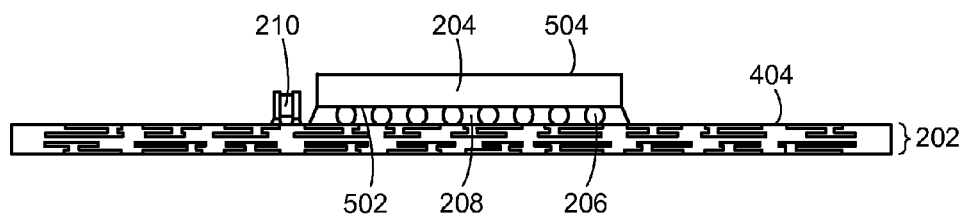
FIG. 5 is the structure of FIG. 4 in a mounting phase of the integrated circuit.

Referring now to FIG. 5, therein is shown the structure of FIG. 4 in a mounting phase of the integrated circuit 204. The integrated circuit 204 can have an active side 502 and a non-active side 504 at an opposite side to the active side 502. The active side 502 can face the package carrier 202.

The active side 502 can be attached over the top side 404 of the package carrier 202. The internal interconnect 206 can be connected to the top side 404 and the active side 502. The underfill 208 can be formed between the top side 404 and the active side 502 to protect the internal interconnect 206.

The component 210 can be attached to the top side 404. The component 210 can be adjacent to the integrated circuit 204.

Figure 6:
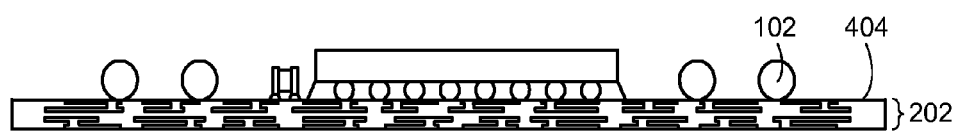
FIG. 6 is the structure of FIG. 5 in a mounting phase of the rounded interconnect.

Referring now to FIG. 6, therein is shown the structure of FIG. 5 in a mounting phase of the rounded interconnect 102. The rounded interconnect 102 can be attached to the top side 404 of the package carrier 202. For example, the rounded interconnect 102 can be a top solder ball of a base package, a bottom package, or a package with another package stacked thereover of a package-on-page (PoP) packaging system.

Figure 7:
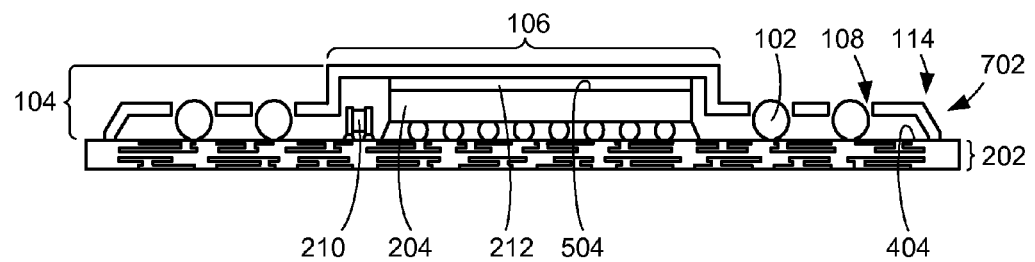
FIG. 7 is the structure of FIG. 6 in an attaching phase of the conductive shield.

Referring now to FIG. 7, therein is shown the structure of FIG. 6 in an attaching phase of the conductive shield 104. The conductive shield 104 can have the elevated portion 106, the hole 108, and the corner extension 114.

The corner extension 114 can include a leg 702 at each corner of the conductive shield 104. For illustrative purposes, the leg 702 is shown having a leg side that is taper or non-vertical, although the leg side can be perpendicular to the top side 404.

The conductive shield 104 can be mounted on the package carrier 202 with the leg 702 of the corner extension 114 attached on the top side 404. The elevated portion 106 can be mounted over the non-active side 504 of the integrated circuit 204 and the component 210.

The adhesive 212 can be attached to the elevated portion 106 and the non-active side 504. The conductive shield 104 can be mounted over the rounded interconnect 102 with the rounded interconnect 102 extending through the hole 108.

The rounded interconnect 102 can be below the elevated portion 106. In other words, a distance between the top side 404 and a top portion of the rounded interconnect 102 can be smaller than a distance between the top side 404 and a top portion of the elevated portion 106.

Figure 8:
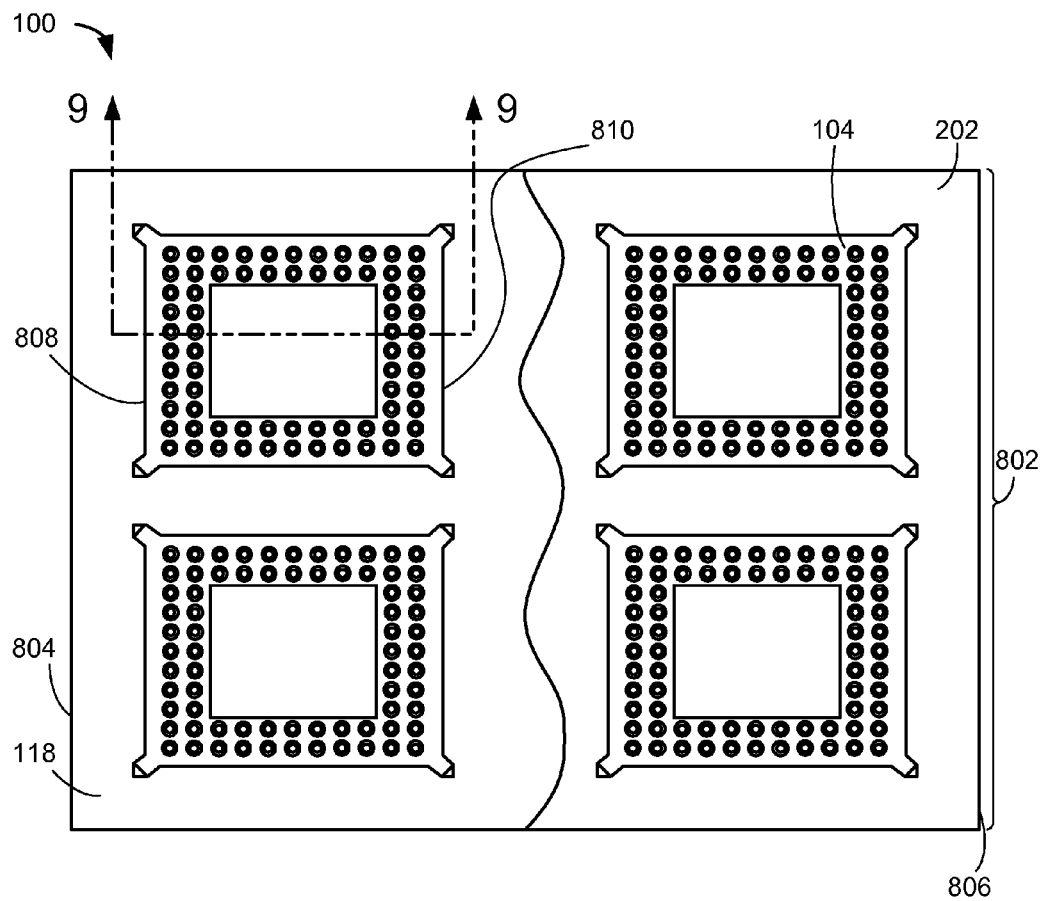
FIG. 8 is a top view of a portion of the integrated circuit packaging system in a molding phase of the encapsulation.

Referring now to FIG. 8, therein is shown a top view of a portion of the integrated circuit packaging system 100 in a molding phase of the encapsulation 118. The top view depicts the encapsulation 118 in a process of being formed.

The integrated circuit packaging system 100 can include a strip 802 having the package carrier 202 made therefrom. A number of the conductive shield 104 can be mounted over the strip 802.

The top view depicts the encapsulation 118 formed from a left side 804 of the strip 802 to a right side 806 of the strip 802. For example, the encapsulation 118 can be formed by molding the encapsulant from a first side 808 of the conductive shield 104 to a second side 810 of the conductive shield 104 that can be opposite to the first side 808. The encapsulation 118 can be formed on the package carrier 202 and under the conductive shield 104.

Figure 9:
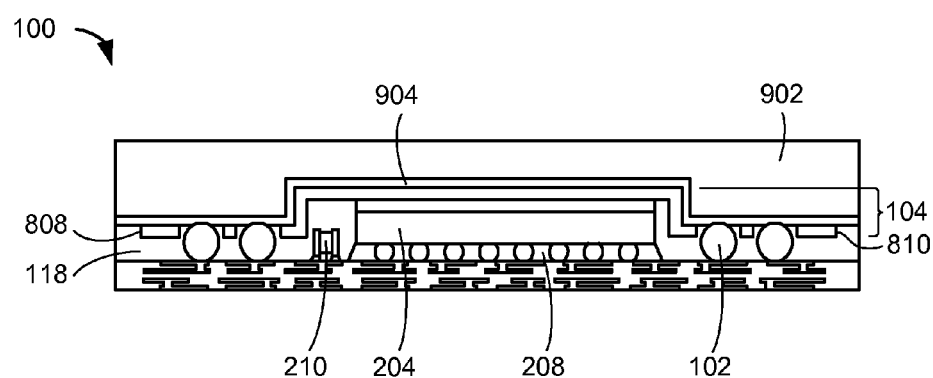
FIG. 9 is a cross-sectional view of the portion of the integrated circuit packaging system along a section line 9-9 of FIG. 8 with a mold chase.

Referring now to FIG. 9, therein is shown a cross-sectional view of the portion of the integrated circuit packaging system 100 along a section line 9-9 of FIG. 8 with a mold chase 902. The encapsulation 118 can be molded with the mold chase 902. For example, the mold chase 902 can be a film assisted mold (FAM) chase.

The mold chase 902 can be mounted over the conductive shield 104 with a buffer layer 904, such as a film, a silicon rubber, or an elastic material. The buffer layer 904 can contact with the mold chase 902, the conductive shield 104, and a portion of the rounded interconnect 102. For example, the buffer layer 904 can be an assisted film.

The encapsulation 118 can be formed by transfer molding processes. For example, the encapsulation 118 can be formed by transferring the encapsulant from the first side 808 of the conductive shield 104 to the second side 810 of the conductive shield 104, filling a space under the buffer layer 904.

The encapsulation 118 can cover the integrated circuit 204, the underfill 208, and the component 210. The encapsulation 118 can partially cover the rounded interconnect 102.

Figure 10:
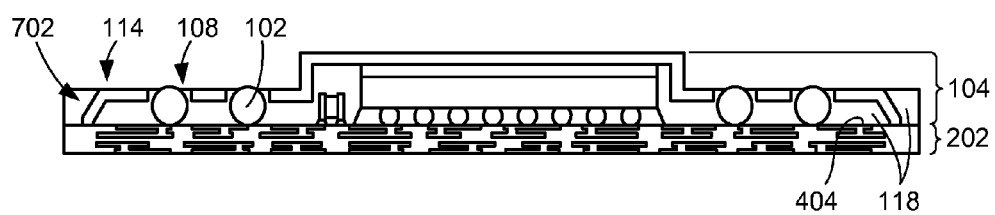
FIG. 10 is the structure of FIG. 7 in the molding phase of the encapsulation.

Referring now to FIG. 10, therein is shown the structure of FIG. 7 in the molding phase of the encapsulation 118. The encapsulation 118 can be formed between the top side 404 of the package carrier 202 and the conductive shield 104.

The encapsulation 118 can cover the leg 702. For example, with the buffer layer 904 of FIG. 9 on a portion of the corner extension 114 having the leg 702 not covered by the buffer layer 904, the encapsulation 118 can be formed over the leg 702 and in a space between the leg 702 and the buffer layer 904.

After the molding phase of the encapsulation 118, the mold chase 902 of FIG. 9 and the buffer layer 904 of FIG. 9 can be removed. The encapsulation 118 can be coplanar with the conductive shield 104. The rounded interconnect 102 within the hole 108 of the conductive shield 104 can be exposed from the encapsulation 118.

The rounded interconnect 102, the conductive shield 104, and the encapsulation 118 can have characteristics of the mold chase 902 and the buffer layer 904 removed. The characteristics can include physical features, such as a tread or an imprint within a surface of the rounded interconnect 102, the conductive shield 104, or the encapsulation 118.

Figure 11:
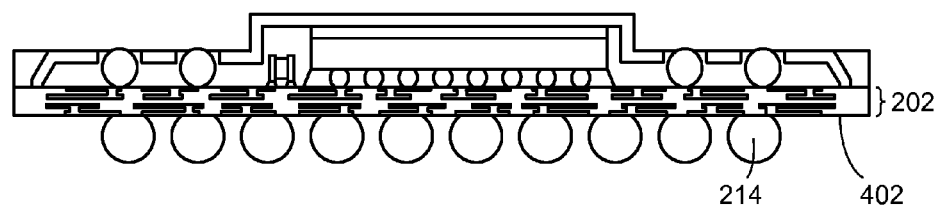
FIG. 11 is the structure of FIG. 10 in an attaching phase of the external interconnect.

Referring now to FIG. 11, therein is shown the structure of FIG. 10 in an attaching phase of the external interconnect 214. The external interconnect 214 can be attached to the bottom side 402 of the package carrier 202. For example, the external interconnect 214 can be a solder ball.

The external interconnect 214 can be formed in an area array. For example, the external interconnect 214 can be formed in a full area array or a peripheral array along a perimeter of the package carrier 202.

Figure 12:
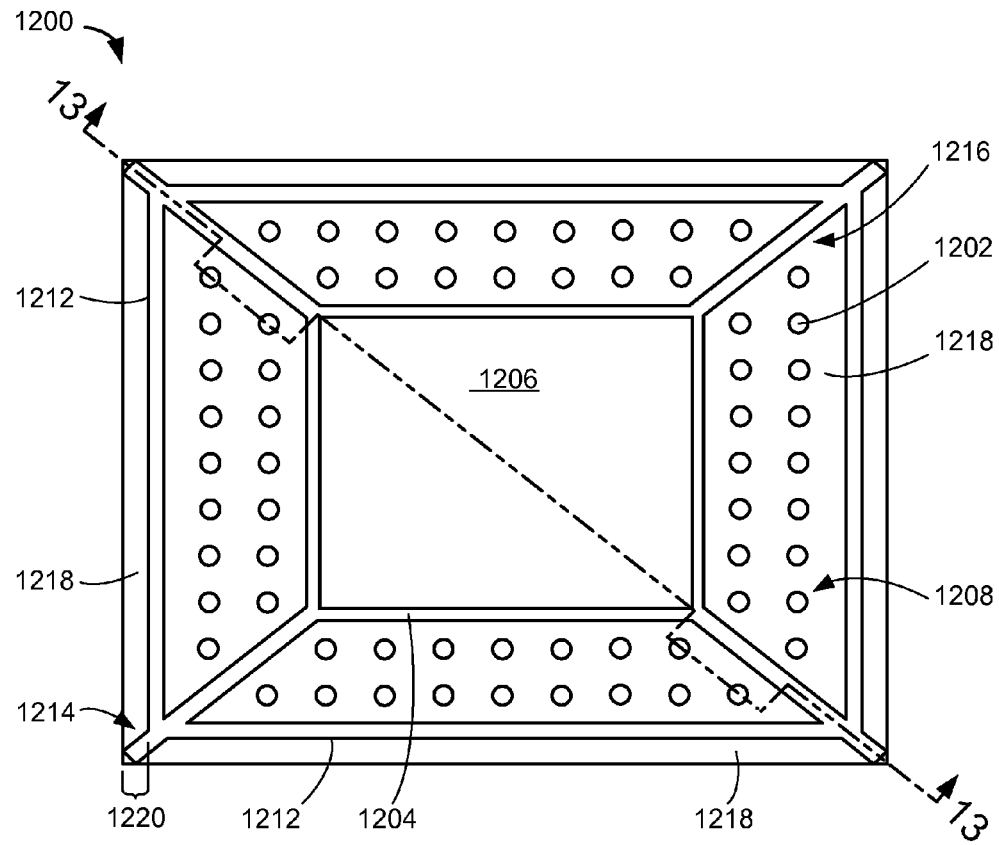
FIG. 12 is a top view of an integrated circuit packaging system in a second embodiment of the present invention.

Referring now to FIG. 12, therein is shown a top view of an integrated circuit packaging system 1200 in a second embodiment of the present invention. The integrated circuit packaging system 1200 can include a rounded interconnect 1202, such as a conductive ball or a conductive bump.

The rounded interconnect 1202 can be formed with solder, a metallic material, an alloy, or a conductive material, providing connectivity to other packaging systems. The rounded interconnect 1202 can be formed in a peripheral array.

The top view is shown with a conductive shield 1204, such as a metal shield, an electromagnetic interference (EMI) shield, or a radio frequency (RF) shield. The conductive shield 1204 can be formed with an elevated portion 1206 at an interior region of the conductive shield 1204. The elevated portion 1206 can be surrounded by the peripheral array of the rounded interconnect 1202.

The conductive shield 1204 can have a hole 1208 with a number of the rounded interconnect 1202 therein. The hole 1208 can be adjacent to the elevated portion 1206. The hole 1208 can have a number of geometric shapes, such as a circle, an oval, an ellipse, a rectangle, or a polygon.

The conductive shield 1204 can have an edge 1212 partially along a periphery of the conductive shield 1204. The conductive shield 1204 can have a corner extension 1214 at each corner of the conductive shield 1204. The edge 1212 can be between the corner extension 1214 and another of the corner extension 1214.

The conductive shield 1204 can have an abutment portion 1216 adjacent to the corner extension 1214. The abutment portion 1216 can be formed between the hole 1208 and another of the hole 1208.

An encapsulation 1218, such as a cover including an encapsulant, an epoxy molding compound, or a molding material, can be formed under the conductive shield 1204 partially covering the rounded interconnect 1202. The encapsulation 1218 can isolate the rounded interconnect 1202 from the conductive shield 1204 at the hole 1208. The number of the rounded interconnect 1202 within the hole 1208 can be partially exposed from the encapsulation 1218.

The encapsulation 1218 can extend beyond the edge 1212. There can be a gap 1220 between the edge 1212 and a periphery of the encapsulation 1218.

Figure 13:
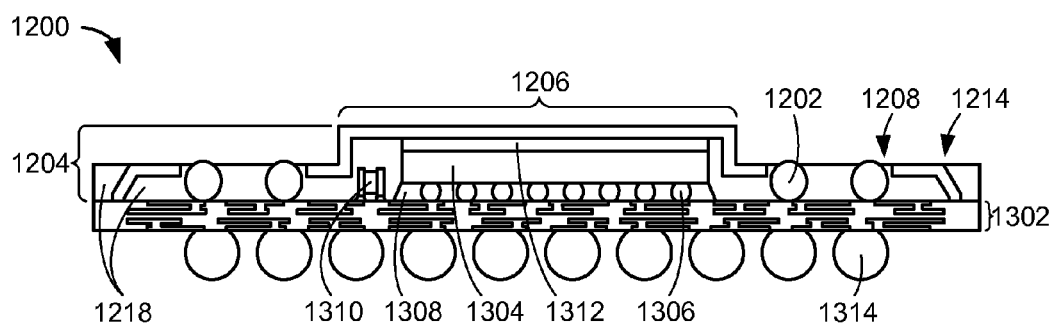
FIG. 13 is a cross-sectional view of the integrated circuit packaging system along a section line 13-13 of FIG. 1.

Referring now to FIG. 13, therein is shown a cross-sectional view of the integrated circuit packaging system 1200 along a section line 13-13 of FIG. 1. The integrated circuit packaging system 1200 can include a package carrier 1302, such as a substrate, a leadframe, or a printed circuit board (PCB).

An integrated circuit 1304, such as a flip chip, an integrated circuit die, or a semiconductor device, can be mounted over the package carrier 1302. The integrated circuit 1304 can be connected to the package carrier 1302 with an internal interconnect 1306, such as a ball, a bump, or a connector.

The internal interconnect 1306 can be formed with solder, an alloy, or a conductive material. An underfill 1308, such as an epoxy resin or any underfill resin material, can be dispensed in a space between the package carrier 1302 and the integrated circuit 1304 to protect the internal interconnect 1306.

A component 1310, more specifically a passive device or a discrete component, can be mounted over the package carrier 1302. The component 1310 can be adjacent to the integrated circuit 1304.

The rounded interconnect 1202 can be mounted on the package carrier 1302. The rounded interconnect 1202 can be adjacent to the integrated circuit 1304 or the component 1310.

An adhesive 1312, such as a film or a conductive adhesive, can be attached on the integrated circuit 1304. The adhesive 1312 can conduct heat away from the integrated circuit 1304 to the conductive shield 1204.

The conductive shield 1204 can be mounted over the package carrier 1302 and the integrated circuit 1304. The conductive shield 1204 can include the elevated portion 1206 and the hole 1208 adjacent to the elevated portion 1206. The number of the rounded interconnect 1202 can extend through or exposed from the hole 1208.

The conductive shield 1204 can be mounted over the package carrier 1302. The elevated portion 1206 can be mounted over the integrated circuit 1304 with the adhesive 1312 in between. The corner extension 1214 can be mounted on the package carrier 1302.

The encapsulation 1218 can be formed over the package carrier 1302 covering the integrated circuit 1304, the underfill 1308, and the component 1310. The encapsulation 1218 can partially cover the rounded interconnect 1202.

The encapsulation 1218 can be formed between the conductive shield 1204 and the package carrier 1302. The number of the rounded interconnect 1202 within the hole 1208 can be partially exposed from the encapsulation 1218. The encapsulation 1218 can cover a portion of an exterior of the corner extension 1214.

The encapsulation 1218 can be exposed in the hole 1208. The encapsulation 1218 can be coplanar with the conductive shield 1204 within the hole 1208.

An external interconnect 1314, such as a ball, a bump, or a connector, can be attached to the package carrier 1302. The external interconnect 1314 can be formed with solder, an alloy, or a conductive material, providing connectivity to external systems.

It has been discovered that the conductive shield 1204 having the hole 1208 significantly improves processes of forming the encapsulation 1218. With the hole 1208 having a size larger than that of the hole 108 of FIG. 1, formation of the encapsulation 1218 is enhanced with better EMC filling and flow, resulting in the processes significantly improved.

It has also been discovered that the conductive shield 1204 having the hole 1208 greatly enhances reliability. While providing EMI shielding without covering the rounded interconnect 1202, the hole 1208 with the number of the rounded interconnect 1202 formed therein provides better alignment between the conductive shield 1204 and the rounded interconnect 1202. The better alignment prevents the rounded interconnect 1202 from being shorted to another of the rounded interconnect 1202 or the conductive shield 1204, thereby greatly enhancing the reliability.

Figure 14:
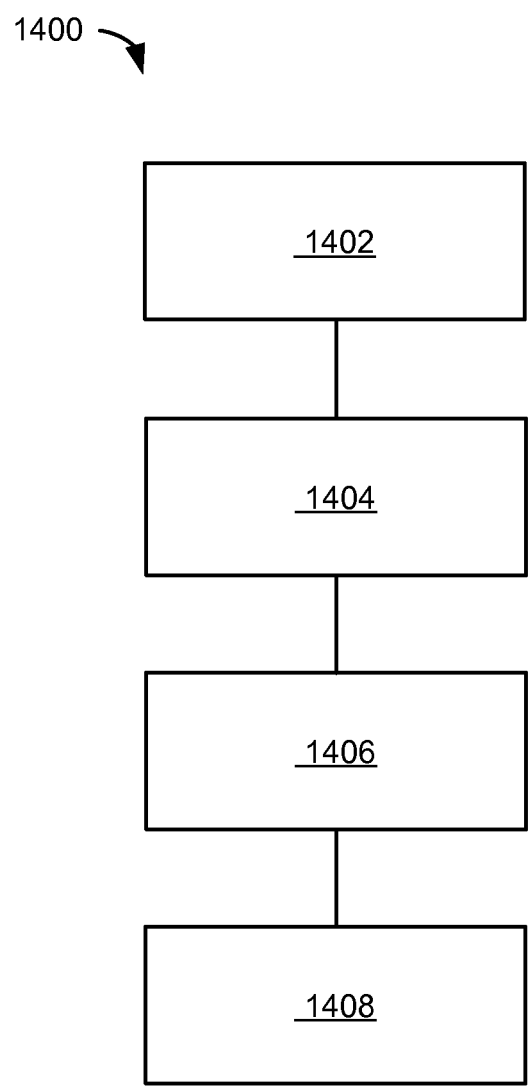
FIG. 14 is a flow chart of a method of manufacture of an integrated circuit packaging system in a further embodiment of the present invention.

Referring now to FIG. 14, therein is shown a flow chart of a method 1400 of manufacture of the integrated circuit packaging system 100 in a further embodiment of the present invention. The method 1400 includes: mounting an integrated circuit over a package carrier in a block 1402; mounting a rounded interconnect on the package carrier in a block 1404; mounting a conductive shield over the package carrier, the conductive shield having an elevated portion and a hole adjacent to the elevated portion with the elevated portion over the integrated circuit and the rounded interconnect exposed from the hole in a block 1406; and forming an encapsulation between the conductive shield and the package carrier with the rounded interconnect exposed in a block 1408.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
mounting an integrated circuit over a package carrier;
mounting a rounded interconnect on the package carrier;
mounting a conductive shield over the package carrier, the conductive shield having an elevated portion and a perimeter portion below the elevated portion, the perimeter portion having a hole, wherein the rounded interconnect is mounted within the hole, and wherein the hole exposes the rounded interconnect from the conductive shield; and
forming an encapsulation between the conductive shield and the package carrier with the rounded interconnect exposed from the encapsulation.

2. The method as claimed in claim 1 wherein forming the encapsulation includes forming the encapsulation within the hole, the rounded interconnect isolated from the conductive shield by the encapsulation.

3. The method as claimed in claim 1 wherein mounting the rounded interconnect includes mounting the rounded interconnect below the elevated portion.

4. The method as claimed in claim 1 wherein mounting the conductive shield includes mounting the conductive shield having a fiducial mark thereon.

5. The method as claimed in claim 1 wherein mounting the conductive shield includes mounting the conductive shield having an edge, a corner extension, and another of the corner extension, the edge between the corner extension and another of the corner extension.

6. A method of manufacture of an integrated circuit packaging system comprising:
mounting an integrated circuit over a package carrier;

mounting a rounded interconnect on the package carrier;
attaching an adhesive to the integrated circuit;
mounting a conductive shield over the package carrier, the conductive shield having an elevated portion and a perimeter portion below the elevated portion, the elevated portion attached to the adhesive, the perimeter portion having a hole, wherein the rounded interconnect is mounted within the hole, and wherein the hole exposes the rounded interconnect from the conductive shield; and
forming an encapsulation between the conductive shield and the package carrier with the rounded interconnect exposed from the encapsulation.

7. The method as claimed in claim 6 further comprising:
mounting a component over the package carrier; and
wherein:
mounting the conductive shield includes mounting the elevated portion over the component.

8. The method as claimed in claim 6 further comprising attaching an external interconnect to the package carrier, the conductive shield grounded with the external interconnect.

9. The method as claimed in claim 6 further comprising mounting a mold chase having a buffer layer over the conductive shield.

10. The method as claimed in claim 6 wherein mounting the integrated circuit includes mounting a flip chip over the package carrier.

11. An integrated circuit packaging system comprising
a package carrier;
an integrated circuit over the package carrier;
a rounded interconnect on the package carrier;
a conductive shield over the package carrier, the conductive shield having an elevated portion and a perimeter portion below the elevated portion, the perimeter portion having a hole, the rounded interconnect within the hole, and wherein the hole exposes the rounded interconnect from the conductive shield; and
an encapsulation between the conductive shield and the package carrier with the rounded interconnect exposed from the encapsulation.

12. The system as claimed in claim 11 wherein the encapsulation is within the hole, the rounded interconnect isolated from the conductive shield by the encapsulation.

13. The system as claimed in claim 11 wherein the rounded interconnect is below the elevated portion.

14. The system as claimed in claim 11 wherein the conductive shield has a fiducial mark thereon.

15. The system as claimed in claim 11 wherein the conductive shield includes an edge and a corner extension, the edge between the corner extension and another of the corner extension.

16. The system as claimed in claim 11 further comprising an adhesive attached to the integrated circuit; and
wherein:
the conductive shield having the elevated portion attached to the adhesive; and
the rounded interconnect extending through the hole.

17. The system as claimed in claim 16 further comprising:
a component over the package carrier; and
wherein:
the conductive shield includes the elevated portion over the component.

18. The system as claimed in claim 16 further comprising an external interconnect attached to the package carrier, the conductive shield grounded with the external interconnect.

19. The system as claimed in claim 16 wherein the conductive shield over the package carrier includes the conductive shield having a corner extension on the package carrier.

20. The system as claimed in claim 16 wherein the integrated circuit is a flip chip over the package carrier.

* * * * *